United States Patent [19]

Marshall et al.

[11] Patent Number: 4,755,866
[45] Date of Patent: Jul. 5, 1988

[54] ELECTRONIC CIRCUIT MODULE

[75] Inventors: Paul N. Marshall, Avon; Boyd W. Rhodes, Glastonbury, both of Conn.

[73] Assignee: United Technologies Corporation, Hartford, Conn.

[21] Appl. No.: 19,918

[22] Filed: Feb. 27, 1987

[51] Int. Cl.[4] .............................................. H05K 1/14
[52] U.S. Cl. ........................................ 357/81; 357/74; 357/82; 361/382; 361/385; 361/389; 361/398; 361/412; 361/413
[58] Field of Search .......................... 357/74, 81, 82; 361/385, 389, 392, 395, 398, 412, 413, 382

[56] References Cited

U.S. PATENT DOCUMENTS

| | | | |
|---|---|---|---|
| 3,447,037 | 5/1969 | Nissim | 361/412 |
| 3,538,389 | 11/1970 | Levesque et al. | 361/398 X |
| 3,609,463 | 9/1971 | Laboue | 361/413 |
| 3,614,832 | 10/1971 | Chance et al. | 357/74 X |
| 3,772,776 | 11/1973 | Weisenburger | 361/398 X |
| 3,961,228 | 6/1976 | Briggs et al. | 361/412 |
| 4,019,299 | 8/1978 | Cosentino et al. | 361/412 |
| 4,544,989 | 10/1985 | Nakabu et al. | 357/81 X |
| 4,631,636 | 12/1986 | Andrews | 357/82 X |
| 4,652,970 | 3/1987 | Watari et al. | 361/385 |
| 4,689,103 | 8/1987 | Elarde | 361/412 X |

OTHER PUBLICATIONS

Thorpe et al., Multilayer Printed Circuit Board Connections, IBM. Tech. Disc. Bull., vol. #13, #10, May 1971, pp. 3708 & 3709.

Primary Examiner—R. R. Kucia
Attorney, Agent, or Firm—Edward L. Kochey, Jr.

[57] ABSTRACT

A high density of electronic chips 18 includes decals 26,40 which overlay a chip and an adjacent chip. Each decal includes conductor routing 64,67,69,80 to electrically connect the chip circuits. The decals may include capacitors 53,58,60 and terminating resistors 81. The chips are directly connected to the frame 112 or heat sink 116 which may be double sided.

8 Claims, 5 Drawing Sheets

ELECTRONIC CIRCUIT MODULE

DESCRIPTION

The invention relates to packaging of electronic circuits and in particular to a method and appartus for achieving very high circuit densities.

BACKGROUND OF THE INVENTION

Gate count per unit chip area has approximately doubled every year since the early 1960's. As the electronics density increases, the number of input/output terminals required for the chip also increases. The area required to package a chip has therefore become a strong function of the space requirement for the interconnections between chips and the input/output connections.

As the density of the electronic circuits increases, the heat removal per unit area also increases. Accordingly, any design which increases the overall density of the packaging must also account for heat removal requirements.

Particularly with the increasing integration of circuits within a module it is important to be able to test the individual chips and to replace defective chips within the module.

SUMMARY OF THE INVENTION

The high density electronic circuit module includes a support frame structure which functions to hold the chips, to provide a heat sink or heat exchanger and also contains the input/output connections to the module. A plurality of electronic chips are secured to the support frame structure in a substantially coplanar grid-like array. A layered decal overlays each chip and has wings which extend outwardly and overlay either an adjacent decal or a portion of the frame structure.

Each decal is comprised of a plurality of layers formed of conductive and insulating materials. This includes a first personality layer which contains bonding pads located to be electrically connected to corresponding bonding pads on an underlying chip. The decal includes conductive grid layers in the x and y direction and power and ground conductors. It also includes vertical vias or connections which provide innerconnections between the various other conductors. The decals each also include in the wing portions conductors which extend outwardly from the overlaying portion. A plurality of pads in the wing portion are connected to the conductors and located for connecting electrically to either the module framework or an adjacent decal.

The foregoing and other objects and advantages of the present invention may be seen by referring to the following description and claims, read in conjunction with the accompanying drawings.

BEST MODE FOR CARRYING OUT THE INVENTION

Figure 1:
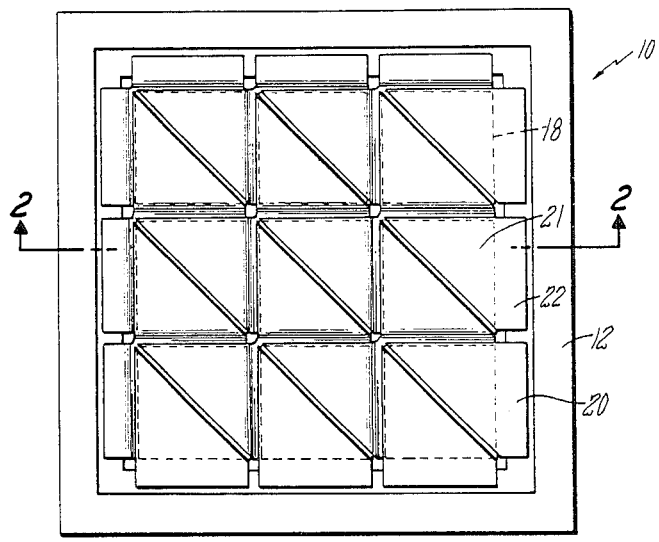
FIG. 1 is an overall plan view of a high density electronic circuit module.

The high density electronic circuit module 10 illustrated in FIG. 1 includes a support frame 12 of cofired alumina in which input and output connections 14 are located terminating in pads 16. Secured to the bottom inner surface of the frame 12 are a plurality of electronic chips 18 with nine being shown for purpose of illustration. Decals 20 are located with an overlaying portion 21 overlaying the chip and with a wing portion 22 extending outwardly thereby overlaying either a portion of the support frame or an adjacent chip.

It can be seen that all electrical connections are made on the top side of the chips and that accordingly the chip may be directly connected to the floor of the support frame. Such connection is preferably the known surface tension method allowing some floating of the chip and simplifying removal of a defective chip. No chip carrier is required, thereby shortening the heat flow path, improving heat transfer and facilitating heat removal through the module either to ambient air or to a heat exchanger. All electrical signal paths between chips are shortened as compared to conventional assemblies.

Cover plate 23 is secured to the module to hermetically seal the structure.

Figure 3:
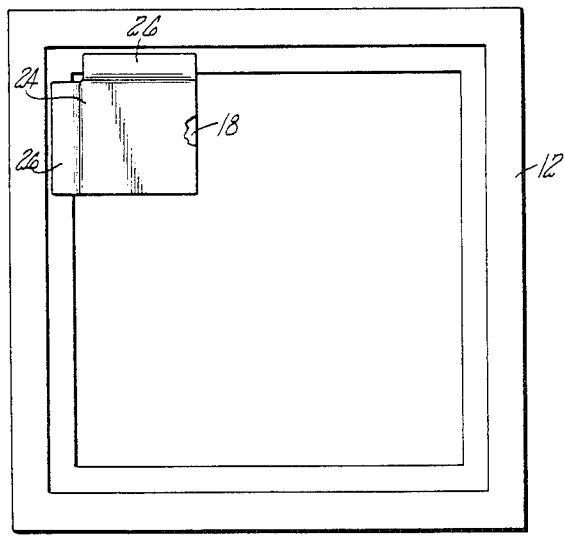
FIG. 3 illustrates the first chip and decal structure being placed within the module.
Figure 4:
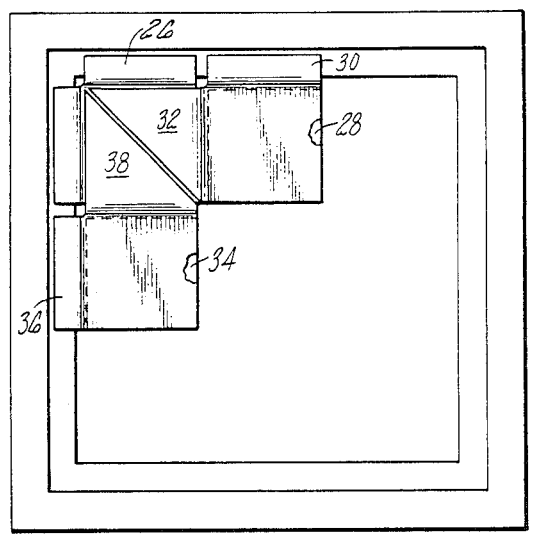
FIG. 4 illustrates the second and third chips and decal structures being placed within the module.
Figure 5:
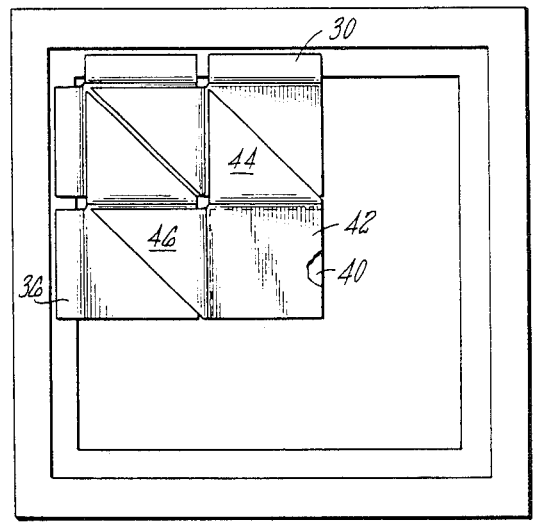
FIG. 5 illustrates the fourth chip and decal structure being placed within the module.

The construction and functions of the decals will be described below. At this point it is only noted that they provide for electrical interconnections between the various chips as well as between the chips and the input/output circuits of the support frame. FIGS. 3, 4, and 5 illustrate the sequence of connections in building up the module so as to more clearly describe what is shown in FIG. 1 as the overall module.

Figure 2:
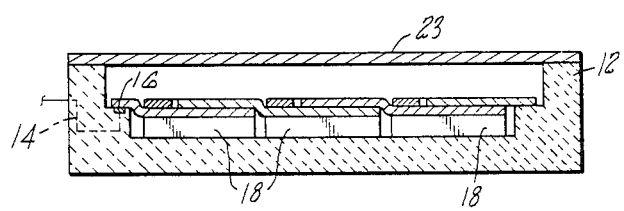
FIG. 2 is a sectional side elevation through the module.

A first electronic chip 18 with decal 24 soldered thereto is placed within the support frame at the corner. The decal has outwardly extending wings 26 which overlay a portion of the support frame and are soldered to the solder pads 16 shown in FIG. 2.

As illustrated in FIG. 4, a second electronic chip 28 is located in closely spaced relationship along side of chip 18 with a decal attached to its upper surface. This also includes a wing 30 which overlies a portion of the support frame and a wing 32 of triangular shape which overlays the previously installed decal 26. Similarly a third chip 34 is located with wing 36 overlaying and contacting the support frame with a triangular wing 38 overlaying another portion of the initially installed decal 24.

FIG. 5 illustrates the installation of fourth chip 40 to which is attached a decal 42. In a module having many more chips than the nine shown here this is essentially the standard form of decal which would be used many times over. This chevron shaped pattern is used for all innerconnections except for those where the side connections are being made to the support frame. This decal 42 has a triangular wing 44 which overlays the decal 30 and a triangular shaped wing 46 which overlays the decal 36. The triangular shape of the wing is the one which will contain the maximum number of inner-connection pads while the triangular form may be substantially truncated where fewer innerconnections are required.

Figure 6:
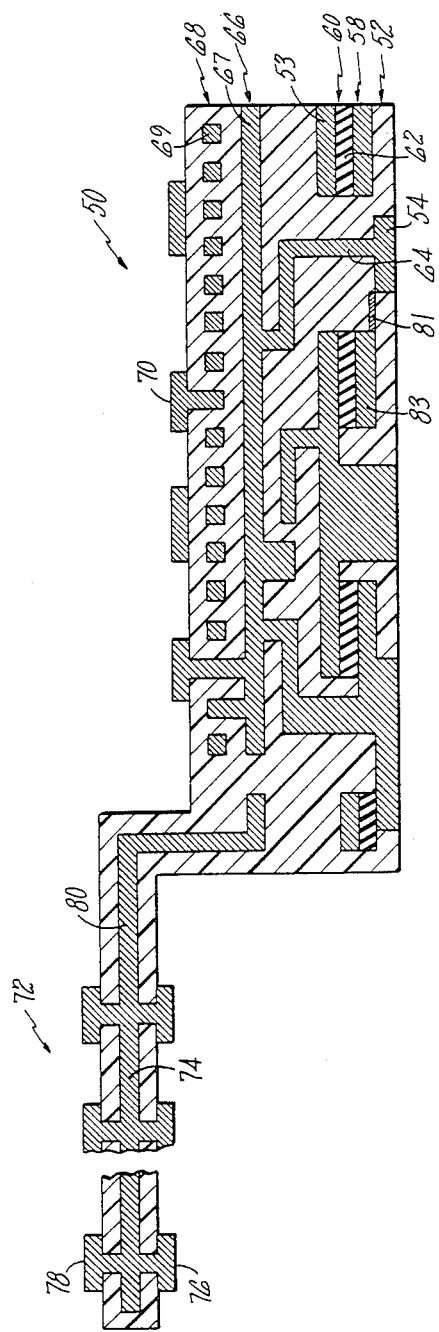
FIG. 6 is a sectional side elevation through the layered decal.

FIG. 6 is a sectional elevation through a typical decal 50. The term decal is used to define this structure and is not meant to imply that there is any transferal process involved in its use. The decals are built-up in layers and perform the function of electrically innerfacing with a chip underlying each decal, conveying the electrical signals in selected pads through the decal and carrying the signals over to adjacent locations where electrical connections are made. Appropriate design and material selection of the decal also permits including power supply decoupling capacitance and characteristic impedance line terminating resistors within the decal.

The lower or first layer 52 is termed a personality layer which includes pads 54 located to mate and be soldered to corresponding pads on particular chips. Accordingly, this layer must be custom designed for the particular chip to which it is to be attached. This first layer may include not only the pads but some of the conductors passing in the x or y direction to route the signals through the decal. Also in this layer is a insulating material 56 of a low dielectric material preferably of a dielectric constant less than four which fills the space between the conductors. A second layer 58 also includes conductors and insulating material and functions to additionally route signals to various locations through the decal.

A third layer 60 includes high dielectric material 62 at certain locations, this usually being between a ground and power conductor for the purpose of providing power supply decoupling capacitance. Vias or vertical connections 64 are located throughout the decal as required to establish the required electrical circuit. Layer 66 has a plurality of conductors 67 oriented in the x direction while layer 68 has a plurality of conductors 69 oriented in the y direction. This permits routing of the signals to the desired locations throughout the decal. The upper layer includes a plurality of pads 70 which are exposed to facilitate testing and for the connection of other decals thereover. Wing 72 of the decal is offset upwardly to facilitate overlaying an adjacent decal. This includes conductors 74 which carry the signals out to pads 76 and 78.

In addition to interconnecting the chips, the decals also include built-in capacitors and terminating resistors. This avoids the requirement to run connections to adjacent components, thus compacting the structure and permiting higher frequency and lower noise operations due to the reduced lead inductance.

A built-in capacitor is shown in the decal where the high dielectric insulating material 62 and is placed between a metal plate 77 connected to ground and plate 79 connected to power. This lowers the noise contribution because of the inherently small lead inductance. A terminating resistor 81 is applied as a resistive film of NiCr in the area between pad 54 and ground conductor 83. This keeps noise down and minimizes line reflections.

Figure 7:
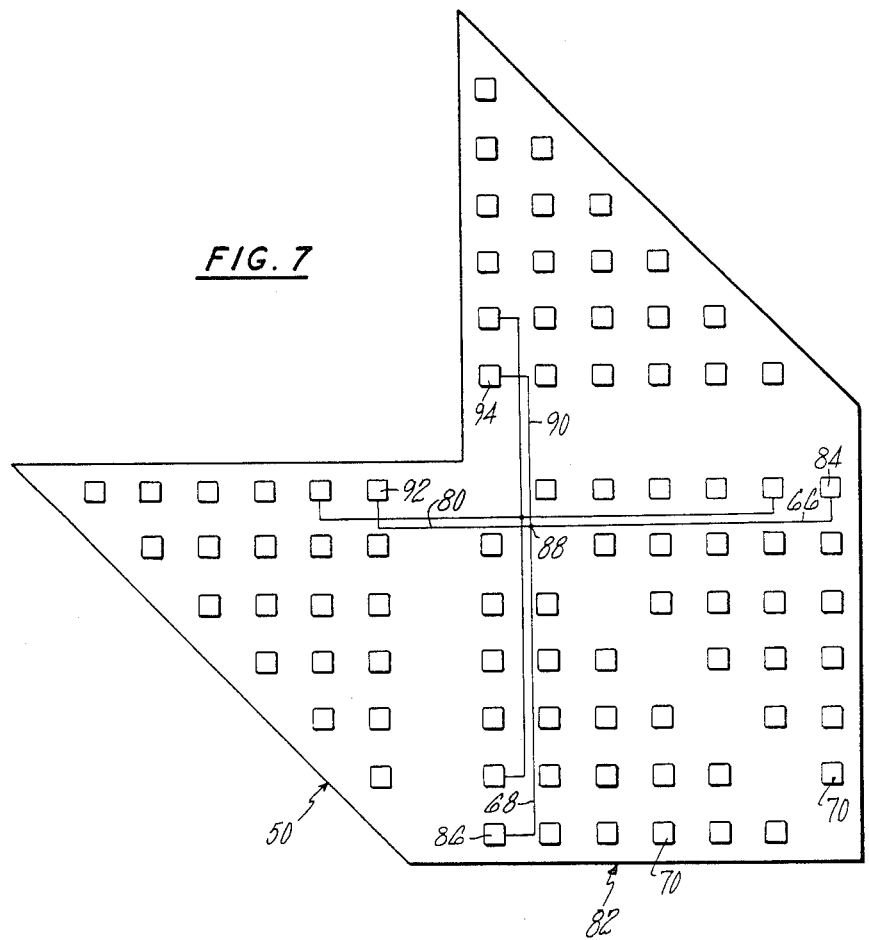
FIG. 7 shows the circuit through the decal to the wings for two pad circuits.
Figure 8:
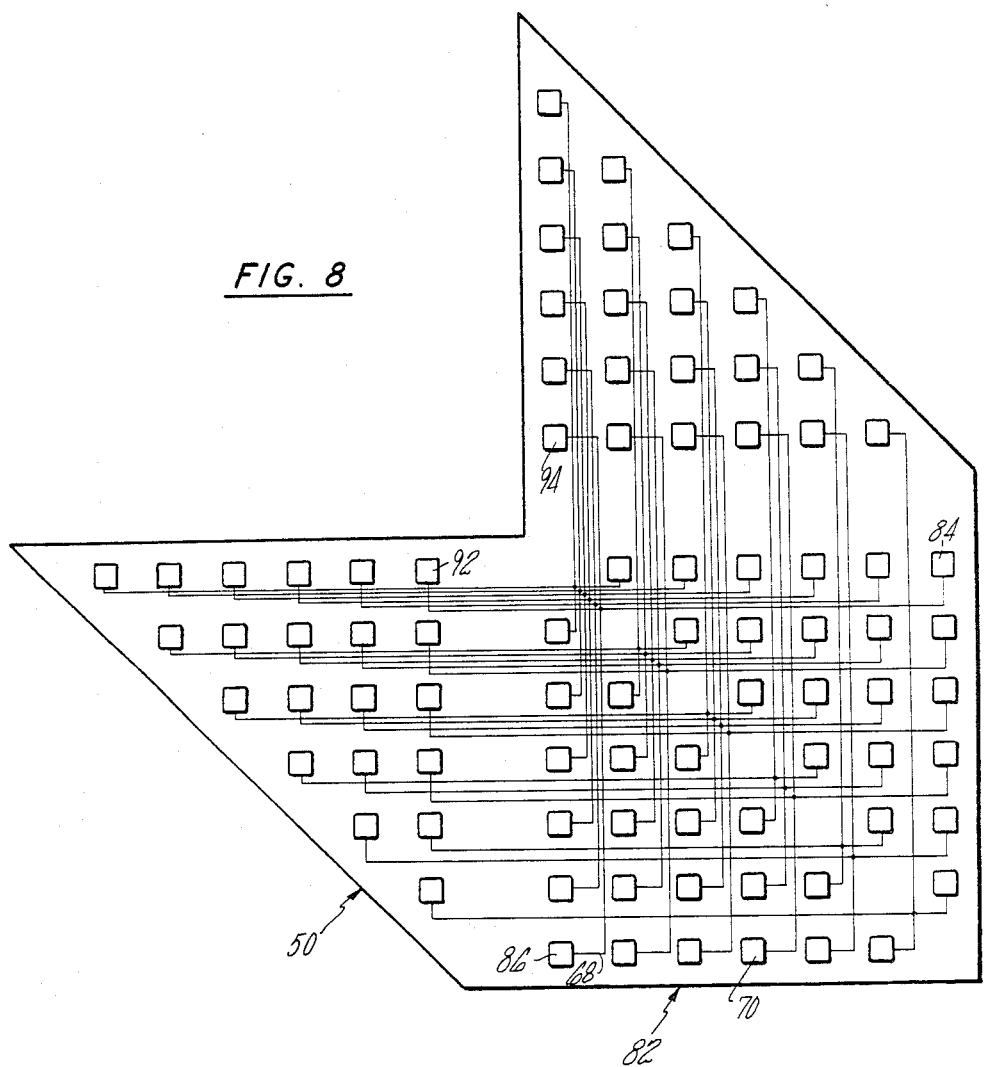
FIG. 8 shows the circuits through the wing to a plurality of pads.

Pads 76 are adapted to connect to pads such as 70 but on an adjacent decal. The pattern of internal connection is illustrated in FIGS. 7 and 8. While the wing is shown as offset it is understood that should the decal material be sufficiently flexible it may be bent upwardly to overlay an adjacent decal and in fact an expansion bend may be placed therein if overall stress analysis suggests that flexibility is required at this location.

Illustrated in FIGS. 7 and 8 is decal 50 having an overlaying portion 82 which overlays a chip located thereunder with the overlaying portion including a plurality of pads 70 arranged in two triangular patterns. This is actually a partial x-ray view showing not only the pads which are exposed but the conductors 66 in the x direction and 68 in the y direction which are actually located below the surface of the decal. It can be seen that the two pads 84 and 86 are connected through conductors 66 and 68 with a vertical via 88. The conductors 80 and 90 extend outwardly therefrom to connect to corresponding pads in the wing 92 and 94. Accordingly, electrical connections are made to identical locations of the various chips. The connection for a second group of pads is also shown although without reference numerals.

FIG. 8 illustrates the overall arrangement with all of the pads being connected. At each pad location in the wing there is both an upper 78 and lower 76 pad (as shown in FIG. 6), with the lower pad beihg used for connection to the overlaying portion of the previously installed decal.

One method of forming the decal involves starting with a temporary substrate. A release agent followed by a flash of gold is applied to the substrate. A photo resist, used to define the desired pattern is spun on, exposed, and developed. The flash of gold is then etched away on the surfaces not covered by the photo resist. The remaining photo resist is removed. This initial sequence is only for the purpose of providing a gold layer to protect the copper pad from oxidizing. Additional copper is laid down on the substrate by sputtering or ION plating until a desired thickness is built-up. Photo resist is spun on, exposed and developed to define the first layer pads. The copper is then etched to form the metal patterns. Polyimide resin is spun on and cured as an insulator, filling the voids between the built-up copper. The photo resist is then removed.

Further layers are built-up by repeating the same general procedure. At selected locations a filled polyamide high dielectric material can be applied for decoupling capacitance. A method for forming this structure is to apply photo resist and to remove it in those selected areas where the high dielectric constant polyimide is to be placed. This polyimide resin is spun on and fills these open areas. The photo resist is removed and the polyimide is cured. Copper is applied and etched to form the via metal. Another photo resist layer is applied and patterned such that it remains over the metal vias and high dielectric filled polyimide. The normal dielectric polyimide resin is spun on and fills the open areas. The photo resist is removed and the polyimide is cured.

The initial three metal layers are specifically designed for the particular chip, while the remaining layers use the identical design in each decal.

The circuit nodes for all of the chips remain exposed and therefore any chip may be conveniently tested at any time. Should there be a need to replace a chip the decals connected to that chip will be cut. A new chip may be replaced with decals overlaying the adjacent chip decals in all four directions. Locating the pads of the wings on the top as well as the bottom permits the installation of this repair decal over the old decal.

Figure 9:
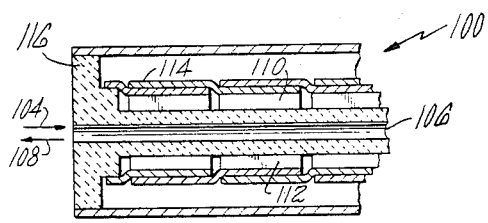
FIG. 9 is a partial section of a double sided module.

FIG. 9 illustrates a double sided module 100 with a fluid cooled heat sink 102. A coolant such as air or water enters inlet 104, passing through passages 106 in the heat sink to exit 108. Chips 110 are secured to the upper surface of the heat sink and chips 112 are secured to the lower side. Decals 114 make connections between chips and to support frame 116 as previously described. A plurality of these modules may be stacked together and cooled from a single manifold if desired.

It should be understood that the invention is not limited to the particular embodiment shown and described herein, but that various changes and modifications may be made without departing from the spirit or scope of this concept as defined by the following claims.

We claim:

1. A high density electronic circuit module comprising:
   a support frame;
   a plurality of electronic chips secured to said support frame in a substantially coplanar grid-like array;
   a plurality of layered decals, each layered decal overlaying a chip;
   each decal having an overlay portion which overlays only the chip and a wing portion extending outwardly from the overlay portion of the decal;
   said decals each comprised of a plurality of layers formed of conducting and insulating materials including, a first personality layer containing bonding pads located within said layer at locations matching bonding pads of the underlying chip, a second grid layer having conductor strips in the x direction, a third grid layer having conductive strips in the y direction, ground conductors in at least one of the layers, power conductors in at least one of the layers, a plurality of vertical vias connecting selected portions of the conductors in accordance with a desired electrical circuit, and insulating material dispersed between the conductors; and
   said wing portion comprised of a plurality of layers having conductors extending outwardly from the overlaying portion, and a plurality of pads connected to said conductors located for connecting electrically to adjacent structure.

2. A module as in claim 1:
   the insulating material being of a low dielectric material of a dielectric constant less than four; and
   high dielectric material located within layers at selected locations only.

3. A module as in claim 2:
   the high dielectric material being located between power conductors and ground conductors.

4. A module as in claim 1:
   the wings of a majority of the decals being connected to an adjacent chip by overlying the decal located thereon.

5. A module as in claim 1:
   each wing having electrically conductive common pads top and bottom at each location, whereby an additional pad may be laid thereover for repair purposes.

6. A module as in claim 1:
   said chips being directly connected to said support frame without any intervening material.

7. A module as in claim 1:
   the insulating material being of a low dielectric material having a dielectric constant which is less than four;
   high dielectric material being located between power conductors and ground conductors;
   the wings of a majority of the decals being connected to an adjacent chip by overlying the decal located thereon; and
   each wing having electrically conductive common pads top and bottom at each location, whereby an additional pad may be laid thereover for repair purposes.

8. A module as in claim 1:
   said support frame including a planar heat sink;
   a passage through said heat sink;
   means for passing a fluid coolant through said heat sink; and
   a plurality of chips secured to each side of said heat sink.

* * * * *